US010429426B1

(12) United States Patent
Tsironis

(10) Patent No.: US 10,429,426 B1
(45) Date of Patent: Oct. 1, 2019

(54) SETUP AND METHOD FOR NOISE PARAMETER MEASUREMENT

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 49 days.

(21) Appl. No.: 15/654,318

(22) Filed: Jul. 19, 2017

(51) Int. Cl.
  *G01R 29/26* (2006.01)
  *G01R 35/00* (2006.01)

(52) U.S. Cl.
  CPC .......... *G01R 29/26* (2013.01); *G01R 35/005* (2013.01)

(58) Field of Classification Search
  CPC .................. G01R 29/26; G01R 31/2626; G01R 31/2616; G01R 31/2839; G01R 31/2837; G01R 27/04; G01R 27/28; G01R 27/06; G01R 27/02; G01R 25/005
  See application file for complete search history.

(56) References Cited

U.S. PATENT DOCUMENTS

| 8,786,293 | B1 * | 7/2014 | Tsironis | G01R 27/06 |
| | | | | 324/613 |
| 8,892,380 | B2 | 11/2014 | Simpson | |
| 9,366,710 | B1 * | 6/2016 | Tsironis | G01R 27/02 |
| 9,459,336 | B1 * | 10/2016 | Tsironis | G01R 35/005 |
| 9,541,592 | B1 * | 1/2017 | Tsironis | G01R 29/26 |
| 2006/0279275 | A1 * | 12/2006 | Simpson | G01R 27/28 |
| | | | | 324/750.16 |
| 2012/0161784 | A1 * | 6/2012 | Benedikt | G01R 31/2822 |
| | | | | 324/612 |
| 2018/0024177 | A1 * | 1/2018 | Himmelfarb | G01R 29/26 |
| | | | | 324/613 |

OTHER PUBLICATIONS

H. Rothe and W.Dahlke, "Theory of Noisy Fourpoles", Proceedings of the IRE, Jun. 1956, pp. 811-818.
"FRIIS, formulas for noise" [online], [Retrieved on Jul. 13, 2016]. Retrieved from Internet <URL: http://en.wikipedia.org/wiki/Friis_formulas_for_noise>.
Sischka, Franz, "Basics of S-parameters, part 1", Characterization handbook, ISBASIC1.doc, Mar. 2002.
"Understanding Noise Parameter Basics/Understanding Noise Parameter Measurements", [online], Application Note AN60-040, Retrieved from Internet <URL: http://www.modelithics.com/literature.asp>.
R. Lane, "The determination of Device Noise Parameters", Proceedings IEEE, vol. 57, pp. 1461-1462, Aug. 1969.

(Continued)

*Primary Examiner* — Thang X Le

(57) ABSTRACT

A noise parameter test setup allows accurately measuring the four noise parameters (Fmin, Rn, Γopt) of microwave transistors over a wide frequency range using two distinct wideband measurement paths, based on differential wafer probes, instead of SPDT switches, to commute between s-parameter (signal) measurement and noise measurement path, avoiding thus the uncertainty of the accuracy as well limited availability of SPDT switches. Calibration of the system is the same as when using switches, when hopping the DUT chip from one set or subset of probes to the next. Additional power control precautions of the VNA sources are necessary to avoid injecting signal power into the sensitive noise receiver during s-parameter measurements and jamming the weak noise power during noise measurement.

7 Claims, 14 Drawing Sheets

(56) References Cited

OTHER PUBLICATIONS

"Reflective 30-80GHz Coaxial SP2T Switch", [online], RF-Lambda—Datasheet [Retrieved on Jun. 7, 2017]. Retrieved from Internet <URL: http://www.rflambda.com/pdf/switchers/RFSP2TA3080G.pdf>.
"Noise Measurements Using the Computer Controlled Microwave Tuner (CCMT) System", AN 1-90, Focus Microwaves, Jan. 1990.
"TRL Calibration" ECE 451 Automated Microwave Measurements; Jose E. Schutt-Aine.
"Broadband Bias Tee", Preliminary Datasheet SHF BT110, [online], [Retrieved on Jun. 1, 2017], Retrieved from Internet <URL: https://www.shf.de/wp-content/uploads/datasheets/datasheet_shf_bt110.pdf>.
"Dual Model 40A Probes", Datasheet, [online], Picoprobe by GGB Industires Inc., [Retrieved on Jun. 9, 2017], Retrieved from Internet <URL http://www.ggb.com/40a.html>.
"Dual Infinity Probe", [online], Cascade Microtech, [Retrieved on Jun. 9, 2017]. Retrieved from Internet <URL: https://www.cascademicrotech.com/products/probes/rf-microwave/infinity-probe/dual-infinity>.
"penprobe.ca RF Probe-test Solution up to 110GHz", Product Fact Sheet [online], Keysight Technologies, literature, [Retrieved on Jun. 4, 2017] datasheet Retrieved from Internet <URL: http://literature.cdn.keysight.com/litweb/pdf/5991-1343EN.pdf?id=2276130>.

\* cited by examiner

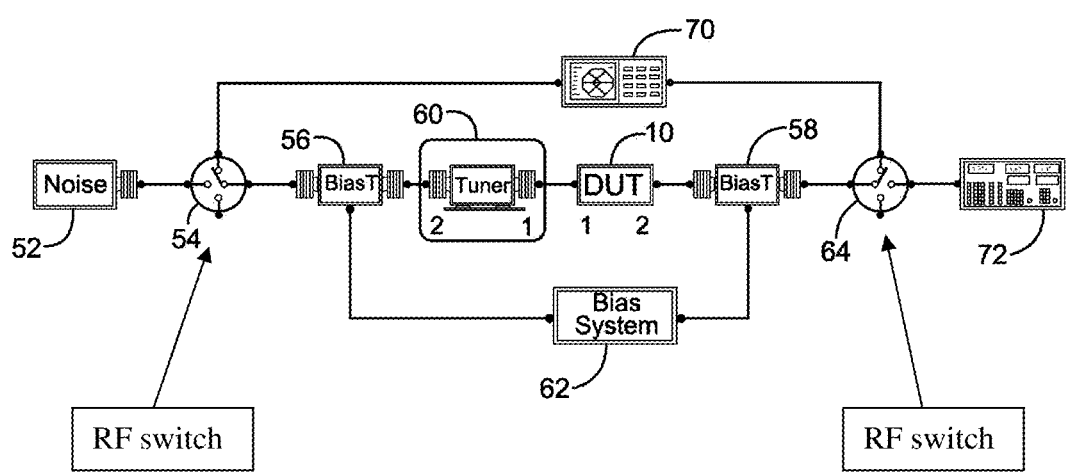
FIG. 1: Prior art

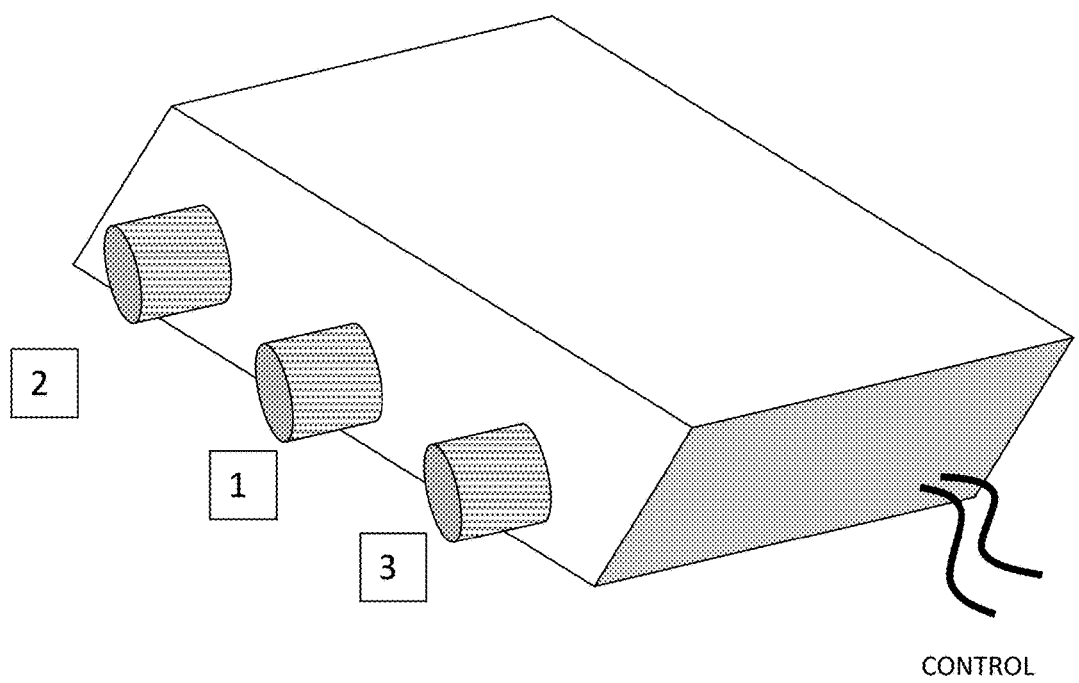
FIG. 2: Prior art

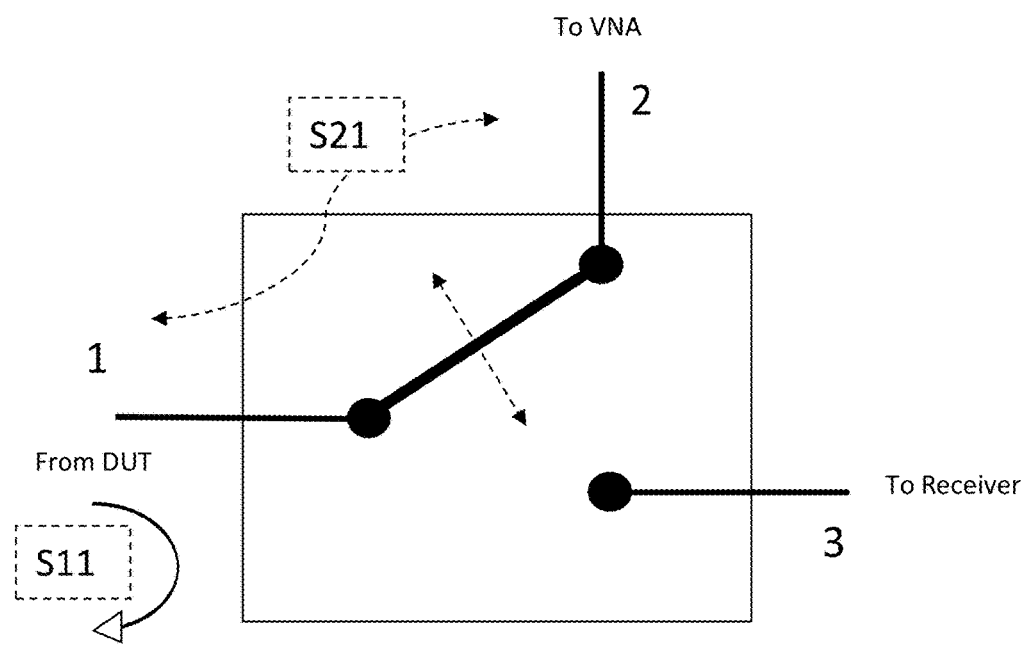
FIG. 3: Prior art

FIG. 4A: Prior art
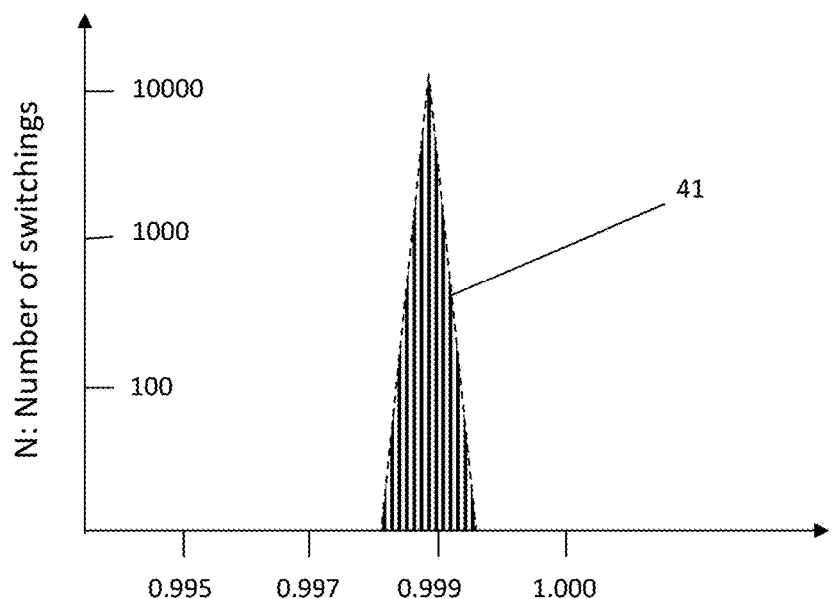
FIG. 4B: Prior art
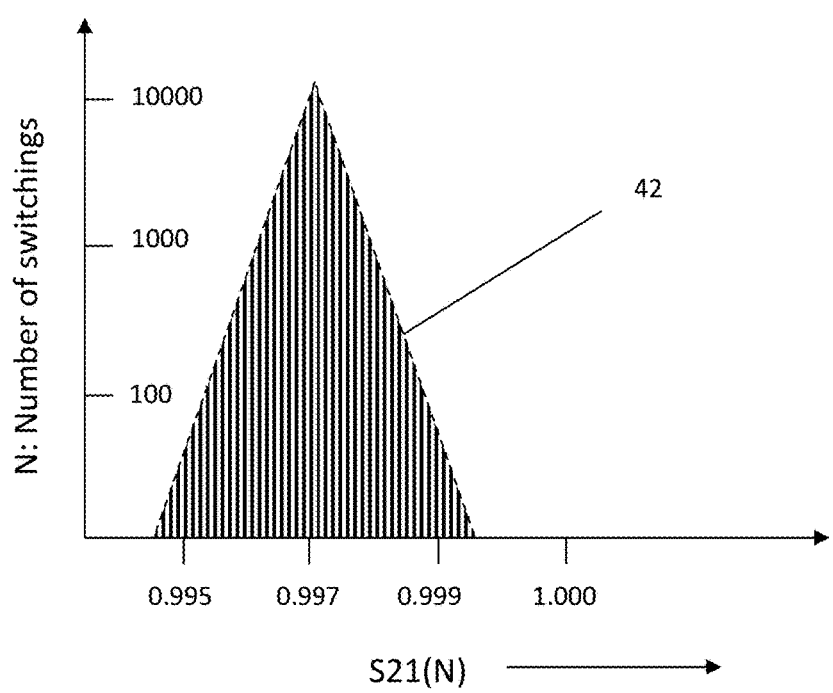

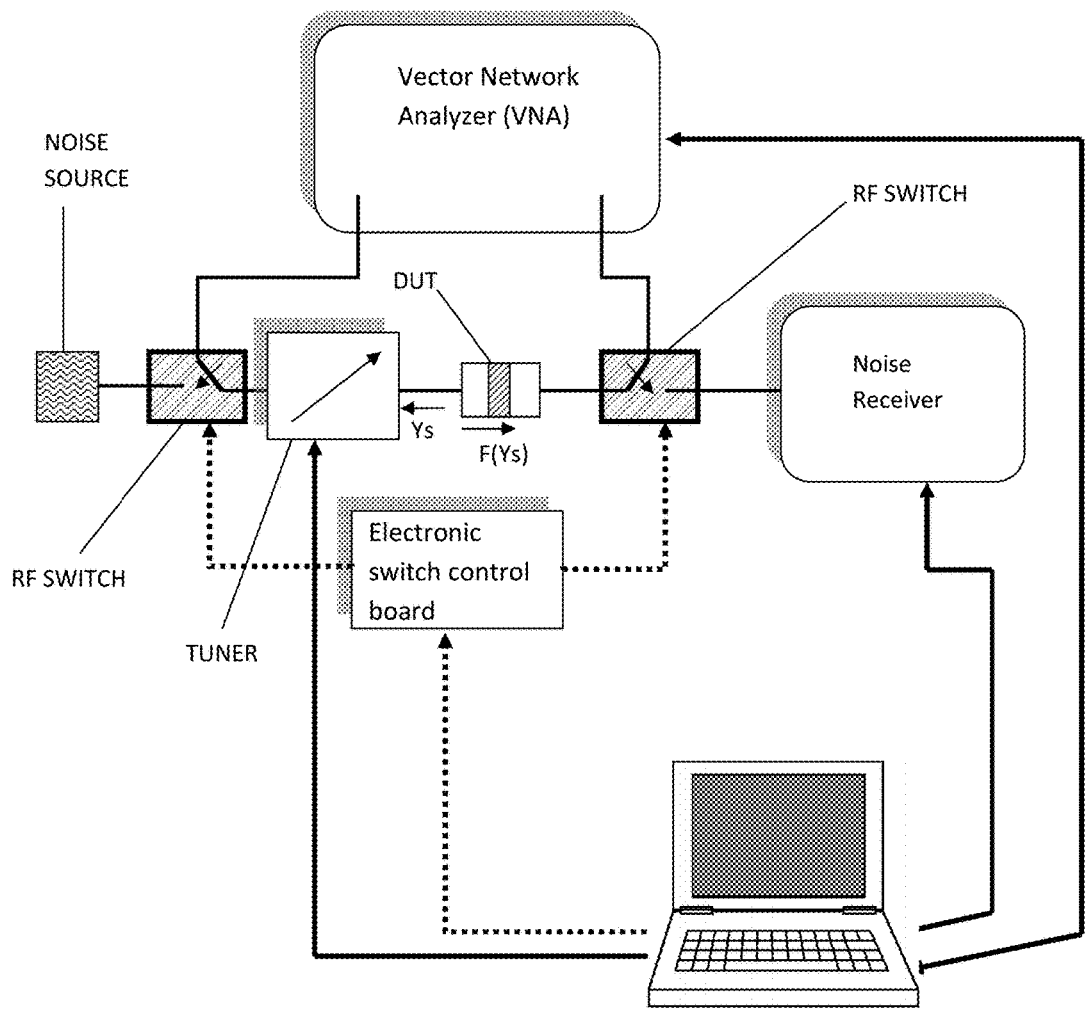
FIG. 5: Prior art

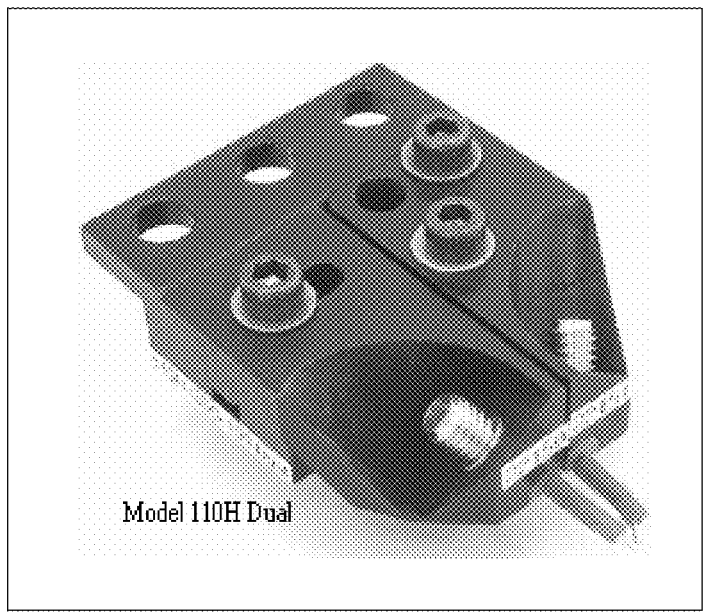
FIG. 7A: Prior art
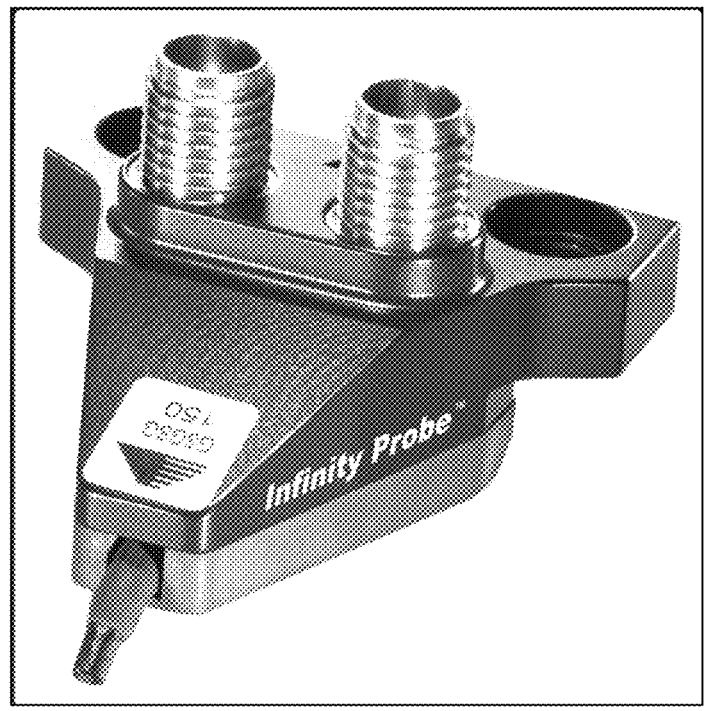
FIG. 7B: Prior art

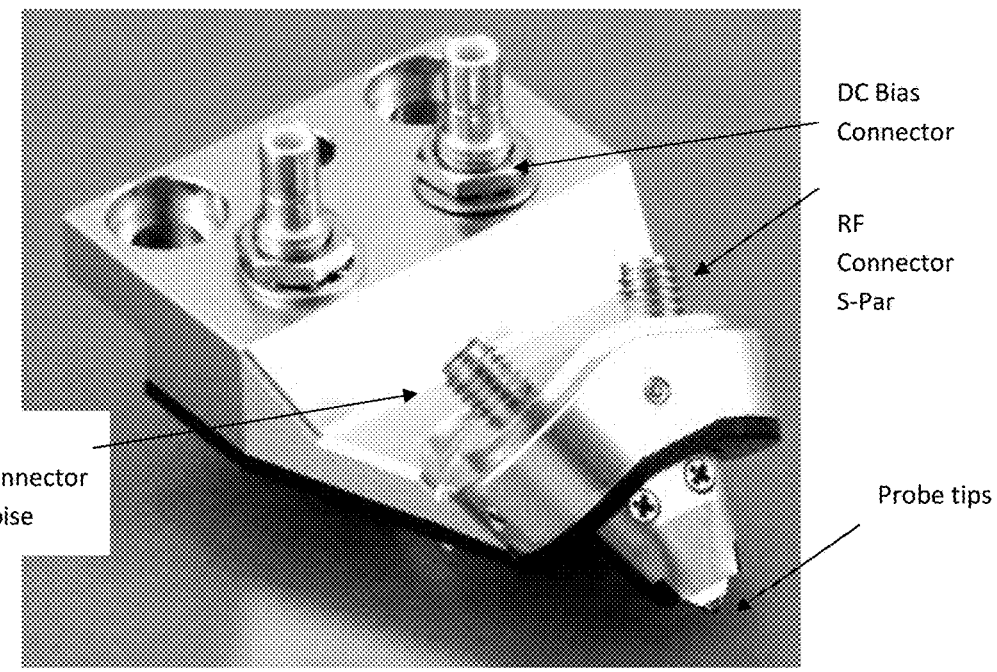
FIG.8A: Prior art
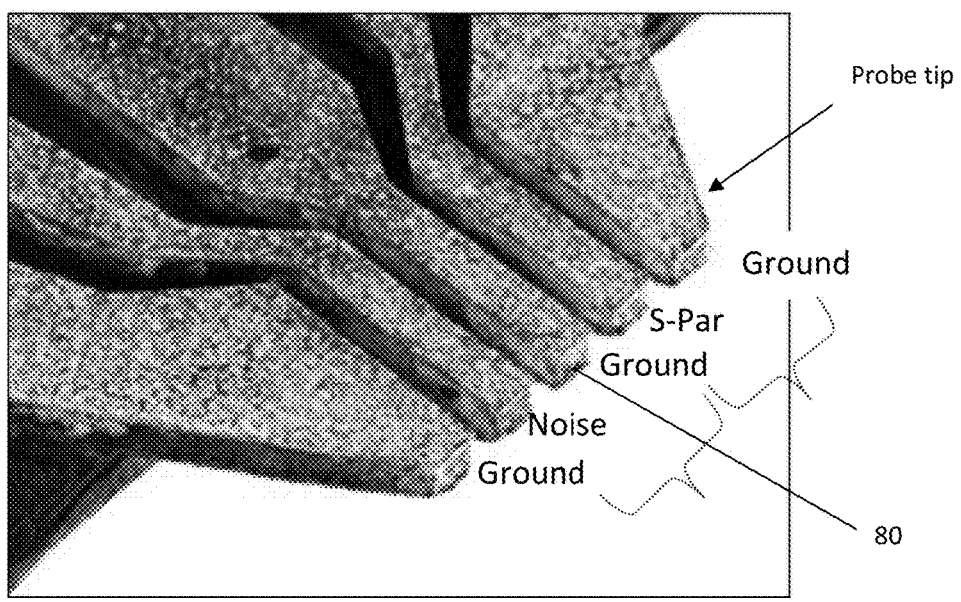
FIG.8B: Prior art

SETUP AND METHOD FOR NOISE PARAMETER MEASUREMENT

PRIORITY CLAIM

Non applicable.

CROSS-REFERENCE TO RELATED ARTICLES

1. H. ROTHE and W. DAHLKE, "Theory of Noisy Four-poles", Proceedings of the IRE, June 1956, pages 811-818.
2. "FRIIS, formulas for noise" [online], [Retrieved on 2016 Jul. 13]. Retrieved from Internet <URL: http://en.wikipedia.org/wiki/Friis_formulas_for_noise>.
3. SISCHKA, Franz, "Basics of S-parameters, part 1", Characterization handbook, ISBASIC1.doc, March 2002.
4. "Understanding Noise Parameter Basics/Understanding Noise Parameter Measurements", [online], Application Note AN60-040, Retrieved from Internet <URL: http://www.modelithics.com/literature.asp>.
5. SIMPSON, G. U.S. Pat. No. 8,892,380, "Data Measurement Methods and Systems".
6. R. LANE, "The determination of Device Noise Parameters", Proceedings IEEE, vol. 57, pages 1461-1462, August 1969.
7. "Reflective 30-80 GHz Coaxial SP2T Switch", [online], RF-Lambda—Datasheet [Retrieved on 2017 Jun. 7]. Retrieved from Internet <URL: http://www.rflambda.com/pdf/switchers/RFSP2TA3080G.pdf>.
8. "Noise Measurements Using the Computer Controlled Microwave Tuner (CCMT) System", AN 1-90, Focus Microwaves, January 1990.
9. "TRL Calibration" ECE 451 Automated Microwave Measurements; Jose E. Schutt-Aine.
10. "Broadband Bias Tee", Preliminary Datasheet SHF BT110, [online], [Retrieved on 2017 Jun. 1], Retrieved from Internet <URL: https://www.shf.de/wp-content/uploads/datasheets/datasheet_shf_bt110.pdf>.
11. "Dual Model 40A Probes", Datasheet, [online], Picoprobe by GGB Industires Inc., [Retrieved on 2017 Jun. 9], Retrieved from Internet <URL http://www.ggb.com/40a.html>.
12. "Dual Infinity Probe", [online], Cascade Microtech, [Retrieved on 2017 Jun. 9]. Retrieved from Internet <URL: https://www.cascademicrotech.com/products/probes/rf-microwave/infinity-probe/dual-infinity>.
13. "PENPROBE.CA RF Probe-test Solution up to 110 GHz", Product Fact Sheet [online], Keysight Technologies, literature, [Retrieved on 2017 Jun. 4] datasheet Retrieved from Internet <URL: http://literature.cdn.keysight.com/litweb/pdf/5991-1343EN.pdf?id=2276130>.
14. Tsironis, C. U.S. Pat. No. 9,366,710, "Noise Parameter Extraction Method".

BACKGROUND OF THE INVENTION AND PRIOR ART

This invention relates to testing and characterization of low noise microwave and RF transistor chips on wafer (device under test, DUT); the method disclosed comprises a test setup and an algorithm for data acquisition allowing extraction of the "four noise parameters" of the DUT. The test setup uses automatic microwave tuners to synthesize reflection factors (or impedances) at the input of the DUT and high sensitivity (noise) receivers for collecting the necessary data using appropriate computer software and control.

All RF two-ports using semiconductor devices (DUT) contain internal noise sources which affect the purity of the signal entering at the input port and exiting (amplified) at the output port. A common way of characterizing the "purity" of the DUT at each frequency and bias condition is the noise figure: F. One definition of the noise figure is the degradation of the signal to noise ratio (S/N) between the input and output port of the DUT expressed as the input to output signal to noise ratio: $F=(S.in/N.in)/(S.out/N.out)$ {eq. 1}, whereby S.in and S.out are the signal power levels at the input and output of the DUT and N.in and N.out the corresponding noise power levels. Since the DUT adds to the transmitted signal its internal noise, the S/N ratio at the input is higher than at the output, therefore $F>1$.

It has been established (see ref. 1) that four real numbers fully describe the noise behavior of any linear noisy two-port; these are the four noise parameters. By, generally accepted convention, the four noise parameters (4NP) are: Minimum Noise Figure (Fmin), Equivalent Noise Resistance (Rn) and Optimum Noise Admittance (Yopt=Gopt+j*Bopt) (see ref. 1). The noise behavior of a two-port only depends on the admittance of the source and not of the load. The general relationship is: $F(Ys)=Fmin+Rn/Re(Ys)*|Ys-Yopt|^2$ {eq. 2}.

F(Ys) in eq. 2 being the noise figure F.total of the chain including the DUT any following hardware, like bias tees and RF switches and the receiver (FIG. 5), the natural law of cascaded noisy two-ports established by FRIIS (see ref. 2) is used to extract the noise figure of the DUT itself: FRIIS' formula is: $F.dut=F.total-(F.rec-1)/Gav.dut(Sij)$ {eq. 3}; hereby F.dut is the noise figure of the DUT, F.rec is the noise figure of the receiver and Gav.dut is the available Gain of the DUT for a given frequency and associated bias conditions. Whereas F.total can be measured directly (see ref. 6) F.rec (Ys) and Gav.dut(Ys, Sij) depend both, (a) on the small signal properties of the DUT (see ref. 3), which are customarily described using the s-parameters, and (b) on the source admittance Ys as per eq. 2; Sij are the DUT s-parameters (see ref. 3). In eq. 3 the available gain Gav.dut of the DUT can only be calculated using Ys and the DUT s-parameters; these s-parameters must be accurate and measured, if possible, immediately before the noise data acquisition, to avoid device drifting, and allow calculations using eq. 3. This is the reason for using RF switches in the measurement path (see ref. 4, items 54 and 64 in FIG. 1 and FIG. 5).

A commonly used prior art test setups are shown in FIG. 1 (see ref. 5); the test system comprises: a calibrated noise source (52), an impedance tuner (60), a test fixture (10) to hold the DUT, a sensitive noise receiver (72) and two SPDT RF switches (54 and 64). The tuner (60) and the noise receiver (72) are controlled by a system computer (not shown), which sets the source admittance Ys, created by the tuner, and retrieves digitally the associated noise measurement data from the noise receiver (72). S-parameters are measured by toggling the RF switches towards the VNA (70). After termination of the measurement session the computer program processes the measured data using above equations and extracts the four noise parameters of the DUT for a given frequency and DUT bias conditions.

There are some endemic problems with RF switches (FIGS. 2 to 4): If they are electronic (based on PIN diodes, see ref. 7) they have limited band width and, especially, high insertion loss (see "insertion loss" in ref. 7); if they are mechanical they have uncertain and often limited repeatability (FIGS. 4A and 4B). An even more important limitation is availability. Today there exist no coaxial RF switches operating above 67 GHz. There exist waveguide switches reaching above 110 GHz, but they are limited in the waveguide bands (50-75 GHz, 60-90 GHz, 75-110 GHz). To configure a 50-110 GHz noise measurement system, for instance, one needs alternative solutions. This is what is proposed in this invention disclosing a test setup that performs the same tasks as the traditional setup without using RF switches.

BRIEF SUMMARY OF THE INVENTION

This invention discloses a measurement setup allowing determination of the four noise parameters of an RF device, preferably o transistor chip as part of a semiconductor wafer. The method allows "in-situ" measuring s-parameters and noise parameters without using RF switches, simply by connecting the chip to two parallel sets of wafer probes or a set of differential probes. No probe movement is required. Operation up to 110 GHz is possible without moving the wafer probes or the tuner attached to the source probe. One path of probes is dedicated to s-parameters and the other to noise. Device "hopping" can be programmed into the probe station or executed by hand.

DESCRIPTION OF THE DRAWINGS

The invention and its mode of operation will be more clearly understood from the following detailed description when read with the appended drawings in which:

FIG. 1 depicts prior art, the principle of noise parameter measurement system using RF switches.

FIG. 2 depicts prior art, a traditional electro-mechanical RF switch.

FIG. 3 depicts prior art, the electrical equivalent of an RF switch.

FIGS. 4A through 4B depict prior art: FIG. 4A depicts typical schematic multiple switching repeatability of good RF switch, FIG. 4B depicts typical schematic multiple switching repeatability of bad (worn out) RF switch.

FIG. 5 depicts prior art: a second block diagram of a traditional noise measurement system using RF switches.

FIGS. 7A through 7B depict prior art: non-biasable 110 GHz differential probes of two manufacturers; FIG. 7A depicts a probe of GGB Industries (see ref. 11); FIG. 7B depicts a probe of Cascade Microtech (see ref. 12).

FIGS. 8A through 8B depict prior art: biasable 110 GHz differential probe; FIG. 8A is a picture of the entire probe; FIG. 8B is a magnified detail picture of the probe tip.

FIG. 11A depicts the s-parameter measurement position; FIG. 11B depicts the noise parameter measurement position; the probes do not move, the wafer "hops" between positions.

DETAILED DESCRIPTION OF THE INVENTION

Figure 6:
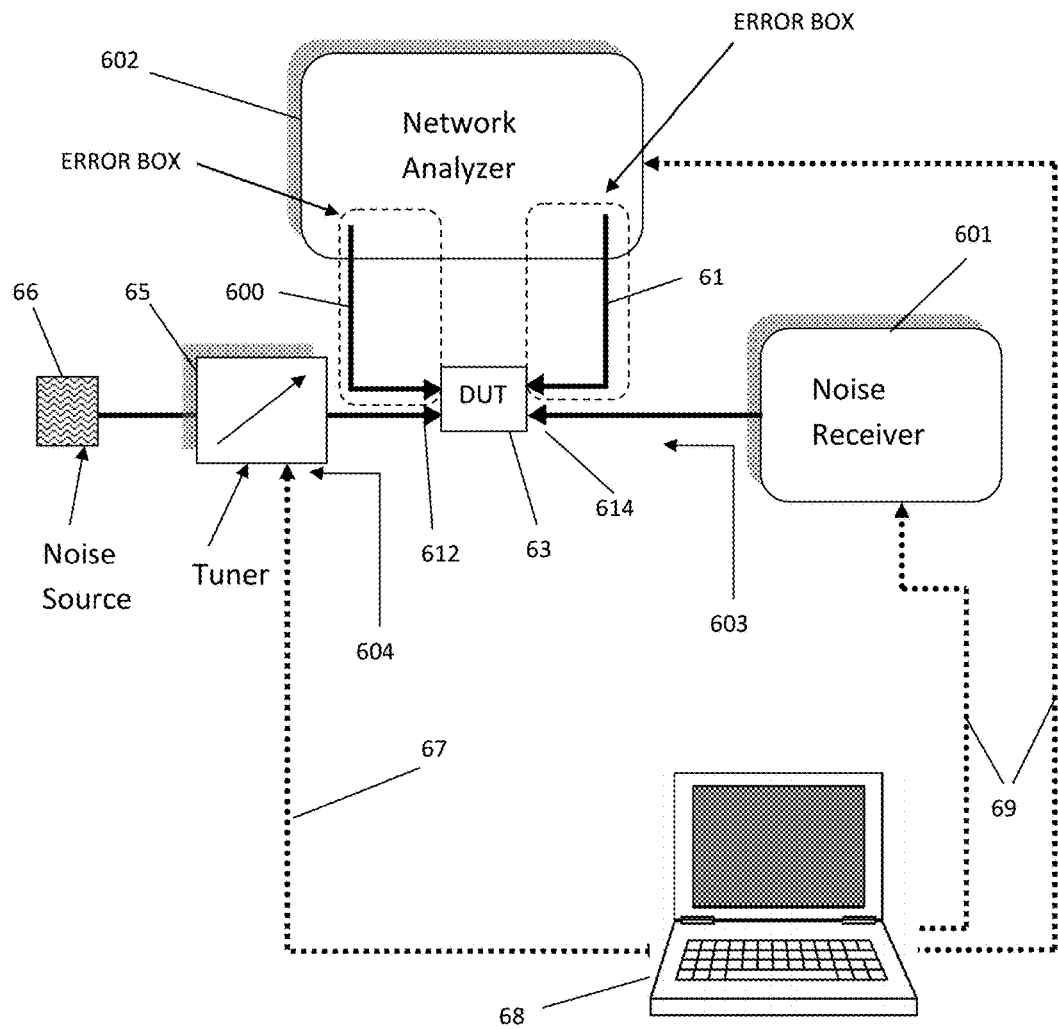
FIG. 6 depicts the block diagram of an "on wafer" noise measurement system comprising two distinct measurement paths configured using biasable differential wafer probes.

The test setup disclosed here (FIG. 6) can be used instead of all hitherto used traditional setups (FIGS. 1 and 5). It comprises a network analyzer (VNA) (602) connected to wafer probes using cables (600, 61), a control computer (68) which controls (67) the tuner (65), the VNA (602) and the receiver (601) using digital cables (69), a calibrated noise source (66) and bias networks (embedded in the wafer probes (612 and 614) or external, depending on the embodiment (see also FIGS. 8, 9 and 12). Because the noise parameters of a DUT cannot be measured directly, the noise figure (F.total) of the whole chain of "tuner (65)-DUT (63) and noise receiver (601)" is measured at a number of source impedances (604) and the noise parameters are extracted using linearization and statistical algorithms (see ref. 14). The noise figure of the DUT (F.dut) itself is extracted from F.total. The relation allowing this is described by the FRIIS formula (see ref. 2). F.dut=F.total−(F.rec−1)/Gav.dut {eq. 3}; herein F.rec is the noise figure of the receiver, which can be calculated as a function of the source admittance, seen by the receiver, using the receiver four noise parameters and the output impedance of the DUT: F.rec=F.rec(Γ.out), because Γ.out of the DUT is the reflection factor corresponding to the source admittance presented to the receiver (603); Gav.dut is the available gain of the DUT (63) at the specific frequency and bias conditions, which depends on the s-parameters of the DUT and the source impedance (604) generated by the tuner (65).

directly, the other parameters (F.rec, Gav.dut) depend directly on the DUT RF parameters, which are best described using its s-parameters (scattering parameters); this can be seen directly as follows if we apply FRIIS' relation to the receiver itself:

$$F.rec = F.rec.min + Rn.rec/G.out * |Yopt.rec - Y.out|^2 \quad \{eq. 4\};$$

and Gav.dut=$|S21|^2*(1-|\Gamma.s|^2)/(|1-\Gamma.s*S11|^2*(1-|\Gamma.out\Gamma^2))$ {eq. 5, see ref. 8, equation A8), whereby Γ.s is the source reflection factor, Y.out=G.out+jB.out is the output admittance (603) of the DUT (which is the source admittance to the Receiver) and Γ.out is the reflection factor corresponding to Y.out, based on the relation Γ=(1−y)/(1+y) {eq. 6}, whereby y=Y/Yo, Y=G+jB=1/Z and Yo=1/Zo=1/50Ω=20 mS.

Considering that Γ.out=S22+(S12*S21*Γ.s)/(1−S11*Γ.s) {eq. 7}, (see ref. 8, equation A1), eq. 3 in its general form, because Γ.out is the source reflection factor seen by the receiver, can be written as:

$$F.dut = F.total - (F.rec(Sij,\Gamma.s)-1)/Gav.dut(Sij,\Gamma.s); \quad \{eq. 8\};$$

Hereby F.total is a directly measured noise quantity and all other components in eq. 8 depend on both Γ.s and the DUT s-parameters Sij, with {i,j}={1,2}. Therefore any changing component when switching between the signal measurement path (s-parameters) and the noise measurement path (by changing Es) will affect the measurement accuracy (see FIGS. 4A and 4B).

Measuring s-parameters and noise figure of the actual DUT under the same conditions, in order to be able to extract the four noise parameters, is therefore a "must" requirement.

If the s-parameters are not exact, the receiver contribution on the overall noise figure will not be able to be calculated accurately and therefore the noise figure of the DUT will be inaccurate. It has been discussed before that RF switches have some endemic problems, such as randomly drifting repeatability (mechanical), as shown by items (41) and (42) in FIG. 4, or insertion loss (electronic, see ref. 7, insertion loss=3 dB, third row in the data table), but, at this time the most important limitation for a millimeter-wave noise test system is that such wideband coaxial RF switches are the only components, that do not exist for frequencies up to 110 GHz.

The solution to this impasse is to use two parallel measurement paths, a signal s-parameter path and a noise path (FIGS. 6, 9 and 12) and not switch between them; instead it is proposed to displace the DUT chip between these paths (FIG. 11) by "hopping" (drop-move-lift) the wafer and by that also the test chip (DUT) between probe tips; in fact it is not the probes that "hop", it is the wafer that drops (to break contact), moves and lifts (to make new contact); an automated wafer probe station can easily be programmed to do that. An appropriate configuration for this is to use differential probes shown in FIGS. 7, 8 and 11 (see ref. 11, 12, 13) having 5 probe tips each (Ground-Signal.1-Ground-Signal.2-Ground), whereby Signal.1 is used for s-parameters and Signal.2 for Noise.

Using biasable differential probes (FIGS. 6 and 8) solves the problem of in-situ biasing the DUT. However, such probes have, typically, higher insertion loss, which will reduce the tuning range of the tuners, because the biasing circuit inside the probes is inserted between the source tuner and the DUT. Alternatively two sets of single ended (not differential probes) can be used, establishing two, mechanically totally distinct, measurement paths; under certain conditions, at least on the noise source side path the probe shall not be biasable and a bias tee is to be inserted between the noise source and the source tuner (FIG. 12, item (120)). In this FIG. 12, all other bias tees (121, 126 and 127), except bias tee (120), can be replaced by biasable single ended wafer probes which have higher insertion loss which, in these cases, is not affecting the tuning range of the tuner (122) and can be calibrated out. It is known that, up to a certain limit, insertion loss can always be calibrated out of any network measurement, except it cannot be compensated, which is critical in particular when it is inserted between the tuner and the DUT. In this case, even though it can be calibrated and accounted for, the loss in tuning range cannot be recovered.

Figure 13:
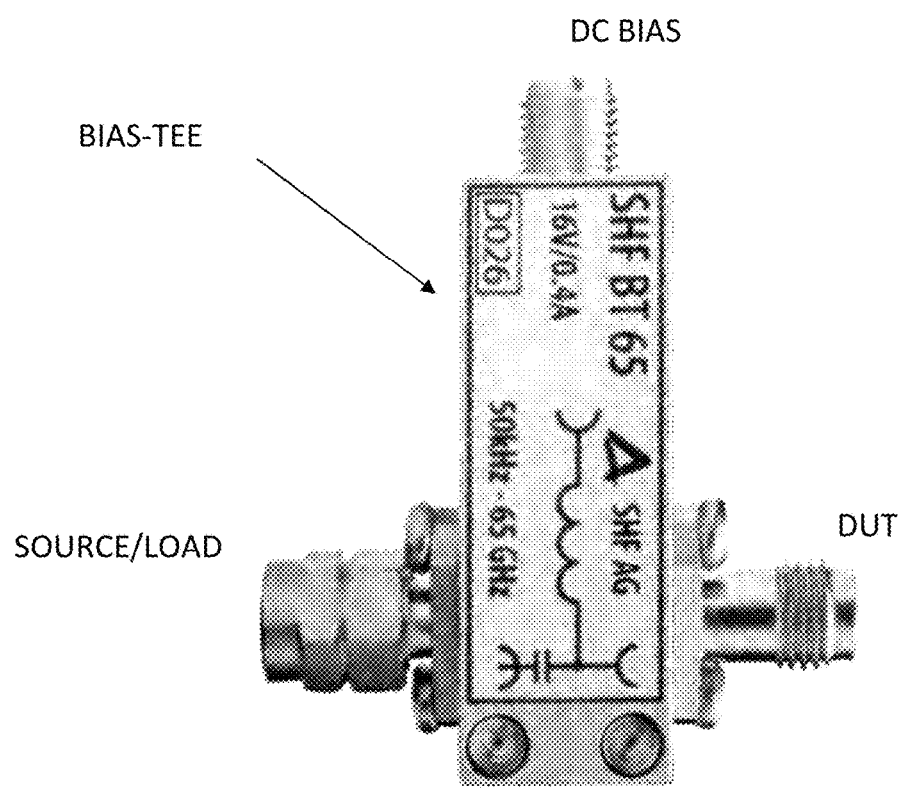
FIG. 13 depicts prior art: a commercially available Bias-Tee (see ref. 10)
Figure 14:
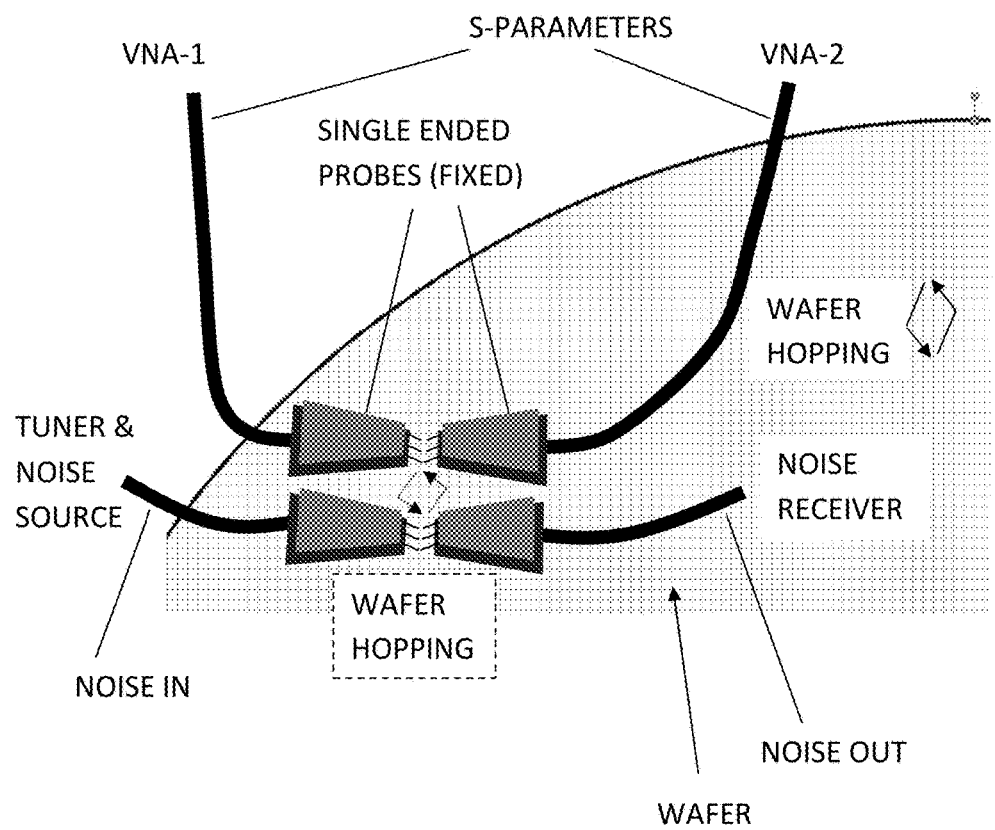
FIG. 14 depicts the wafer operation embodiment using two sets of non-biasable single ended probes on a semiconductor wafer for s-parameter and noise measurement.

In an alternative embodiment (FIG. 14) two sets of single ended wafer probes are used, spaced apart as necessary by the probe mechanics. The spacing is not a problem for an automated probe station that can be instructed to "hop" further away than in the embodiment using differential probes. The concept remains the same: using two parallel and independent signal paths for s-parameters and for noise measurements and hop the same chip from one set of probes to the other. Calibration procedure is the same as with differential probes. In fact signal separation and potential interferences will be better in this embodiment, because of the physical separation of the two paths. As discussed before, three of the new probes can be biasable and the source probe in the noise path shall be non-biasable to reduce insertion loss. For every non-biasable probe, an associated bias-tee must be included (FIGS. 12 and 13).

Figure 10:
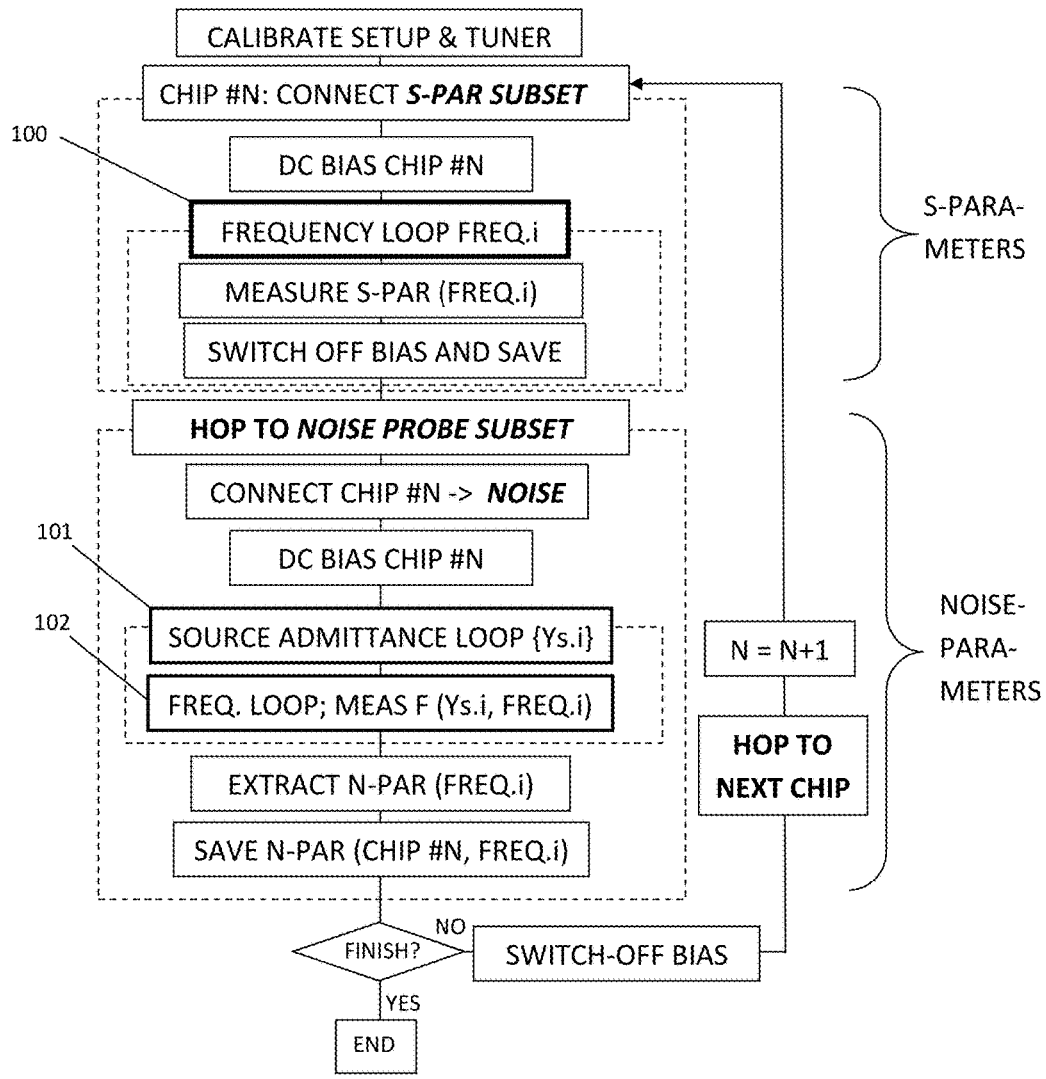
FIG. 10 depicts the step by step flow-chart of the noise parameter measurement method.

The measurement procedure using the "permanent two-path" noise measurement system is illustrated, step-by-step, by the flowchart of FIG. 10. The fundamental difference to all prior art test procedures is that, between s-parameter measurement and noise measurement the DUT (chip) must move from one set of probes or subset of probe tips (FIG. 11) to the other. In laboratory jargon this operation is called "wafer hopping" or "chip hopping", meaning the wafer changes position while the probes remain fixed. This is, by the way, the normal on-wafer testing procedure, for batch testing. The wafer moves up, the chip makes contact, is biased and measured. Then bias is switched off, the wafer drops the break contact, moves so that the chip is under the other set of probe tips, and moves up to make contact again. In detail the steps to follow are: (a) connect a certain chip #N to the s-parameter probe subset and bias it; (b) measure and save s-parameters for all frequencies in the band inside a frequency loop (100); (c) switch off bias and hop the chip to the noise probe subset; (d) re-bias the chip to exactly the same conditions, especially the same drain current as before, and measure noise figure F.total for a multitude of source admittances Ys.i in an impedance loop (101) inside which a frequency loop (102) is nested. This means that for speed reasons it is preferable to sweep the frequency at each impedance, than fix the frequency and step through several impedances. This second measurement sequence (impedance loop (101) inside a frequency loop (102)) is possible and should, theoretically, yield the same results, but suffers (a) from longer test time (because of mechanical tuner movement) and (b) from possible mechanical repeatability inaccuracies, also due to mechanical movement of the probes in the tuner. Instead frequency sweeping (loop (102) inside loop (101) is faster and more accurate. All results are saved after terminating the loops. At this point one option is to extract the noise parameters and save, or to save the raw data and extract in a batch operation afterwards. Some users prefer to have access to the raw data for own comparison and post-processing. Next step is to move to the next chip #N+1 and repeat the procedure.

Figure 9:
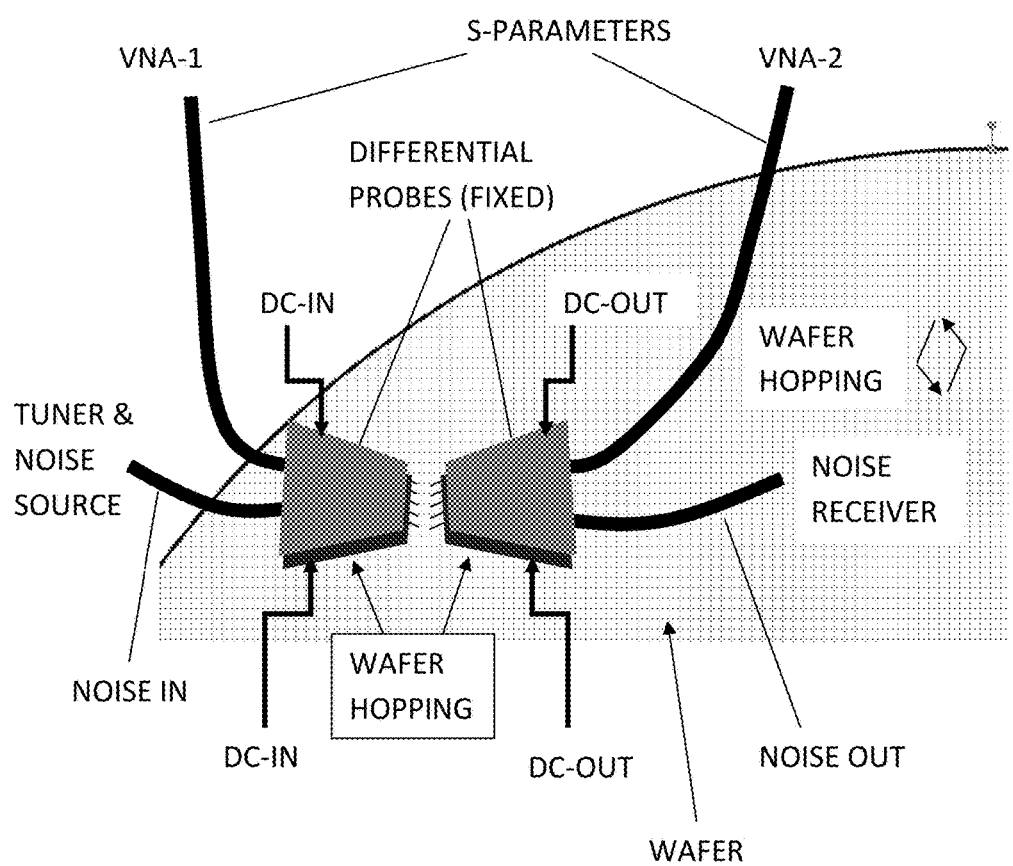
FIG. 9 depicts the wafer operation embodiment using one set of biasable differential probes on a semiconductor wafer for s-parameter and noise measurement.
Figure 11A:
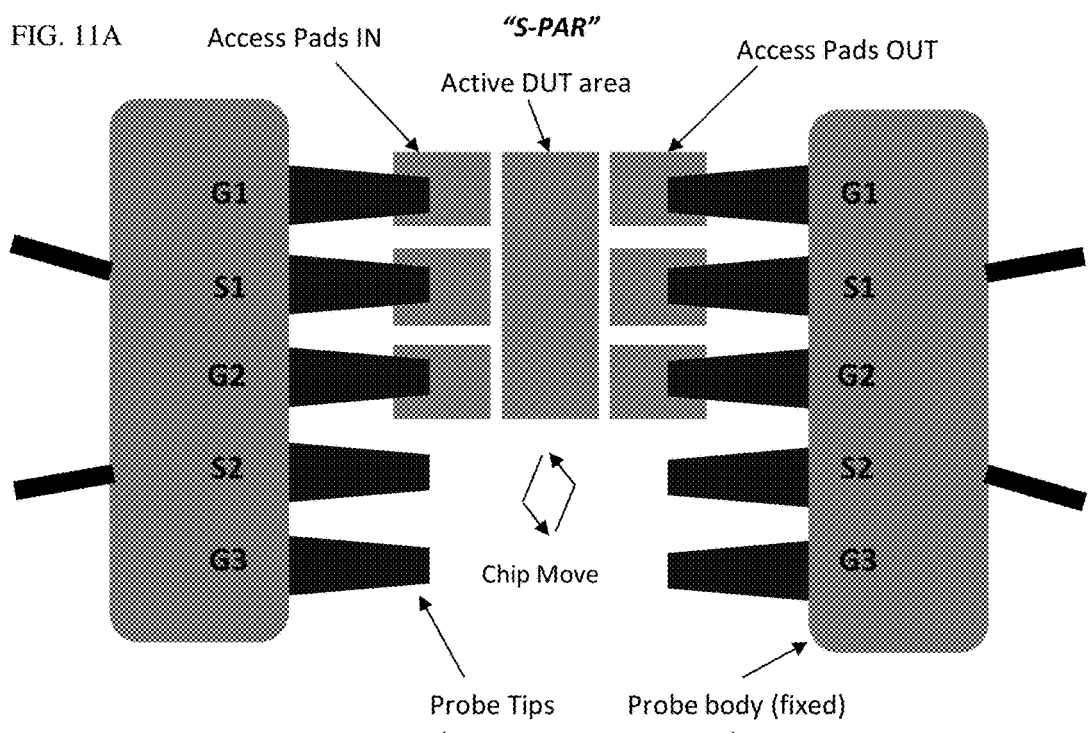
FIG. 11A through 11B depicts the two wafer positions for the measurement configurations.
Figure 11B:
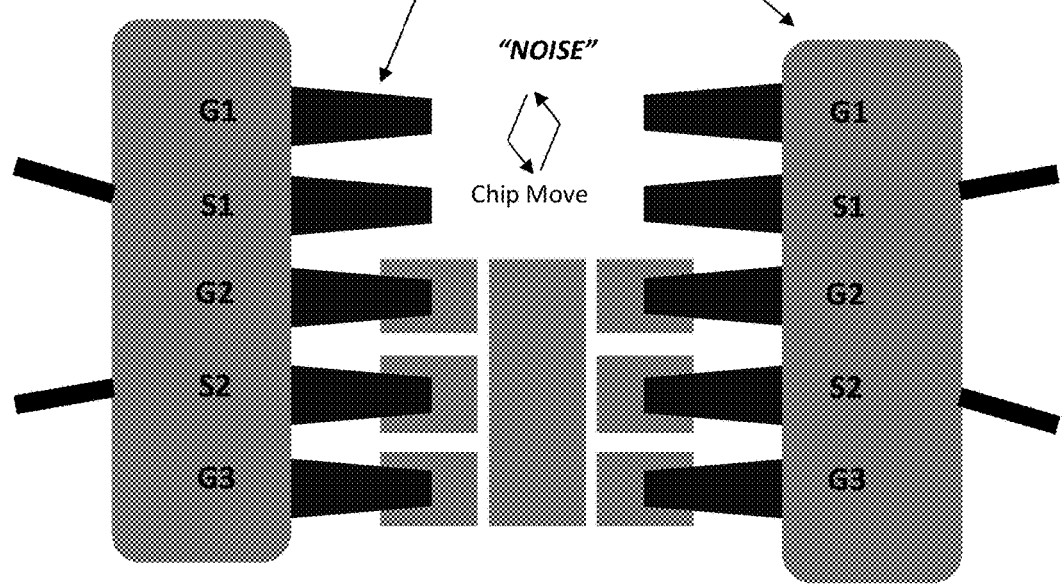

The detail of the setup in the area of the DUT is shown in FIGS. 9 and 11, when using biasable differential probes. These self-explanatory schematics show the operation sequence of the two distinct measurement steps using the two distinct RF paths, each associated with one subset of the differential probe (FIG. 11A or 11B and in FIG. 8B subset Noise or S-par). The central ground terminal (80) is associated to both test paths, therefore, during noise measurements, the s-parameter source must be completely switched off in order to eliminate any leakage into the noise path, which would falsify the results. The operation executes in two subsequent frequency loops using two different sets of calibration data. In s-parameter measurement the calibration performed is, typically, TRL (see ref. 9) on wafer. For this, standards are inserted between the probe tips (FIG. 9) and the input and output "error boxes" between the VNA ports and the probe tips are determined and extracted (de-embedded) using known algorithms. "Error Boxes" are sets of s-parameters describing all interactions, reflections, signal transfers and leakages" between an input port and an output port, whereby here one port is the tips of the wafer probes and the other the test ports of the pre-calibrated VNA. Or, using the "error box" corrections, allows measuring at the probe tips, instead at the VNA test ports. The same is done in the setup of FIG. 12, except in this case also the bias-tees are included in the error boxes. After that all s-parameter measurements are de-embedded (calculated to the DUT access pad reference planes) (FIG. 11).

Figure 12:
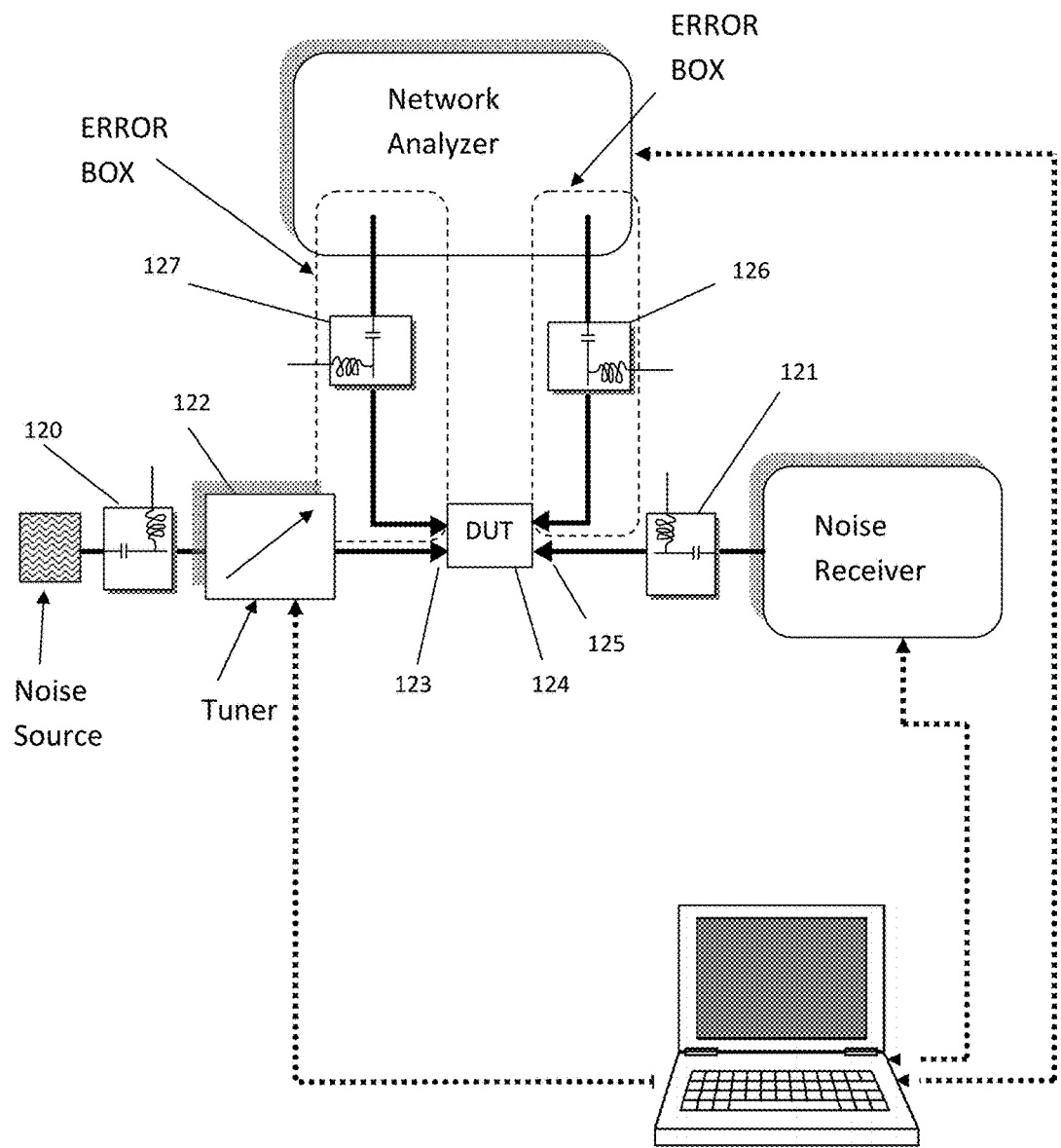
FIG. 12 depicts a block diagram of a noise measurement system comprising two distinct measurement paths configured using non-biasable differential wafer probes and external bias tees.

Calibrations for noise measurements are slightly different (FIGS. 6, 9 and 12). In that case the tuner and noise receiver path must be calibrated independently beforehand by connecting to the VNA, and s-parameters (equivalent small signal "noise-path error boxes"), including the paths from the noise source, bias-tee (120), tuner up to the probe tips (123) and from the probe tips (125) and bias-tee (121) to the receiver, and must be saved in separate files. The tuner itself is calibrated at all frequencies and for a multitude of selected settings (states), preferably covering the maximum range of the Smith chart. After that the VNA is disconnected and a noise calibration is performed, whereby a THRU-line is inserted instead of the DUT (124) (this THRU-line is also part of the prior TRL calibration) and the receiver noise parameters are measured and extracted using a number of tuner settings (see ref. 14). After this step the DUT is inserted, instead of the THRU line, and noise figure measurements are executed. The noise parameter data are extracted using the various prior art (see ref. 14) algorithms, and saved. After that the next chip is contacted, biased and measured, as described before.

This invention discloses embodiments of a noise parameter measurement setup and method allowing on-wafer operation without using RF switches. Obvious alternatives shall not impede on the originality of the invention.

What I claim as my invention is:

1. An on-wafer noise parameter measuring system, being controlled by a computer, for measuring noise parameters and s-parameters of a semiconductor chip on a wafer comprising: a measurement setup,
    wherein the measurement setup comprises
        a noise measurement path for measuring the noise parameters of the chip, and
        an s-parameter measurement path for measuring s-parameters of the chip,
    said noise measurement path including,
        a cascade of calibrated noise source, input impedance tuner, input DC bias network, a first subset of wafer probes, output DC bias network, noise receiver and RF cables;
    and said s-parameter measurement path including,
        a second subset of wafer probes, input and output DC bias networks, RF cables and a vector network analyzer connected to the second subset of wafer probes,
    and wherein
        the bias networks of both paths are connected to DC bias supplies.

2. The measurement setup of claim 1,
    wherein
        both subsets of wafer probes are combined in one set of differential (G1-S1-G2-S2-G3) bias-able probes and there are no external bias-tees,
    and wherein
        probe tips G1-S1-G2 are part of the noise measurement path and probe tips G2-S2-G3 are part of the s-parameter measurement path.

3. The measurement setup of claim 1, wherein at least the wafer-probe on the source side of the noise measurement path is not bias-able and a bias-tee is inserted between the noise source and the tuner.

4. The measurement setup of claim 2 or claim 3, wherein the network analyzer, tuner, bias supplies and noise receiver are operationally controlled by a system computer.

5. The measurement setup of claim 4, wherein all wafer probes are single ended non-bias-able probes and bias-tees are inserted in the associated measurement paths.

6. A noise parameter measurement method for a multitude of frequencies, performed using the apparatus of claim 1, the said method comprising the following steps:
    a) calibrate the setup for the multitude of frequencies;
    b) connect a DUT (chip) to the second subset of wafer probes;
    c) apply DC bias to the chip;
    d) measure s-parameters of the chip for at least part of the multitude of frequencies and save;
    e) switch off the DC bias;
    f) break contact;
    g) connect the chip to the first subset of wafer probes and apply DC bias as in step (c);
    h) in a source admittance loop (SAL), comprising a multitude of source admittances, nested inside a frequency loop (FL), comprising frequencies as in step (d), execute the following steps:
        h1) set the first frequency in the FL loop;
        h2) step through the admittances of the source admittance (SAL) loop;
            h2.1) for each source admittance measure noise figure;
            h2.2) save the noise figure measurement data;
        h3) after termination of the source admittance (SAL) loop, extract the noise parameters and save;
        h4) set the next frequency in the FL loop;
        h5) go to step (h2);
        h6) terminate if the frequency loop (FL) ends;
    i) move to next chip (step (b)).

7. A noise parameter measurement method for a multitude of frequencies, performed using the apparatus of claim 1, the said method comprising the following steps:
    a) calibrate the setup for the multitude of frequencies;
    b) connect a DUT (chip) to the second subset of wafer probes;
    c) apply DC bias to the chip;
    d) measure s-parameters of the chip for the multitude of frequencies and save;
    e) switch off the DC bias;
    f) break contact;
    g) connect the chip to the first subset of wafer probes and apply DC bias as in step (c);
    h) in a frequency loop, comprising at least part of the multitude of frequencies, nested inside a source admittance loop (SAL), comprising a multitude of source admittances, execute the following steps:
        h1) set the first admittance of the SAL loop;
        h2) step through the frequencies of the frequency loop;
            h2.1) for each frequency measure and save the noise figure;
        h3) after termination of the frequency loop
        h5) set the next admittance in the SAL loop;
        h5) go to step (h2);
        h6) terminate if the source admittance loop SAL ends;
        h7) calculate the noise parameters of the chip for the frequencies of the frequency loop;
    i) move to next chip (step (b)).

* * * * *